United States Patent [19]
Raaijmakers et al.

[11] Patent Number: 5,460,689
[45] Date of Patent: Oct. 24, 1995

[54] HIGH PRESSURE PLASMA TREATMENT METHOD AND APPARATUS

[75] Inventors: Ivo J. Raaijmakers, San Jose; Jaim Nulman, Palo Alto, both of Calif.

[73] Assignee: Applied Materials, Inc., Santa Clara, Calif.

[21] Appl. No.: 202,477

[22] Filed: Feb. 28, 1994

[51] Int. Cl.$^6$ .......................... H01L 21/306; B44C 1/22; C03C 15/00
[52] U.S. Cl. ............ 156/643.1; 134/1; 156/644.1; 156/651.1; 156/657.1; 156/345
[58] Field of Search ............................. 156/643, 644, 156/651, 657, 662, 345; 134/1, 31; 204/192.32, 192.37, 298.31, 298.34

[56] References Cited

U.S. PATENT DOCUMENTS

| | | | |
|---|---|---|---|
| 4,698,130 | 10/1987 | Restall et al. | 156/651 X |
| 5,163,458 | 11/1992 | Monroe | 134/1 |
| 5,296,094 | 3/1994 | Shan et al. | 156/651 |
| 5,318,667 | 6/1994 | Kumihashi et al. | 156/651 X |

OTHER PUBLICATIONS

Ohsaki et al., Proc. 2nd Intl. Symp. on ISSP '93 Tokyo, 1993.
Raaijmakers et al., Technical Proc. Semicon Japan SEMI, 1992.

Primary Examiner—William Powell
Attorney, Agent, or Firm—Eric L. Prahl; Robert J. Stern

[57] ABSTRACT

A method of precleaning a wafer including the steps of placing the wafer in a plasma chamber; flowing a gas into the plasma chamber; establishing a plasma in the chamber at a first pressure; after establishing the plasma, plasma etching the wafer at the first pressure for a first period of time; transitioning to a second pressure that is different from the first pressure; plasma etching the wafer at the second pressure for a second period of time; and after the second period of time has elapsed, discontinuing plasma etching at the second pressure.

19 Claims, 2 Drawing Sheets

HIGH PRESSURE PLASMA TREATMENT METHOD AND APPARATUS

BACKGROUND OF THE INVENTION

The present invention relates to a sputter etch process for precleaning semiconductor wafers that have a top layer with contact holes and/or vias formed therein.

Sub 0.5 micron straight walled contacts with high aspect ratio (i.e., ratio of depth to width >2) may be metallized with the use of collimated Ti/TiN PVD (Physical Vapor Deposition) technologies, followed by CVD-W (Chemical Vapor Deposition with tungsten), PVD Al/reflow or cold/hot PVD Al to completely fill the contacts. As illustrated by FIG. 1, however, a straight contact side wall 10 and a sharp upper corner 12 cause a re-entrant structure or overhang 14 in the coherent Ti/TiN deposition.

Although collimated PVD has proven to be able to cover the entire bottom of a contact with vertical sidewalls, parts of the contact walls and base may remain practically void of material if the contact sidewall is (partly) re-entrant. In mass production of devices, it may prove to be difficult to guarantee complete absence of re-entrant structures in the contact hole. For example, re-entrant walls may originate from using etches having isotropic etch components on Si, silicides or the dielectric stack. Although a thinner, or even completely absent Ti contact layer on small areas around the contact periphery is not likely to have serious impact on device performance, absence of barrier material or a discontinuity in the microstructure of the barrier in these regions can lead to catastrophic junction failures due to interaction with the WF chemistry or the Al metallization. For this reason, one typically requires the TiN deposited in the bottom regions of the contact to have a thickness of at least 200 Å (20 nm) to ensure reliable protection of the contact. For typical collimated PVD processes and for 2/1 aspect ratio contacts this would correspond to a TiN thickness on the field of about 700 Å (70 nm). Note that a collimated PVD layer itself will become re-entrant in the top region of the contact as its thickness becomes a significant portion of the width of the contact. This may lead to void formation during subsequent Al deposition or W plug fill.

The re-entrant structure also causes other difficulties during subsequent W deposition. For example it can cause "volcanoes" which are characterized by the peeling away of the TiN layer away from the wafer starting at the narrow region below the re-entrant structure. It also makes it more difficult to fill contacts with PVD Al/reflow or cold/hot PVD Al.

It is known that facetting or rounding of the top corners of the contact hole can prevent or greatly diminish the formation of re-entrant profiles after collimated Ti/TiN PVD deposition (e.g. see A. Ohsaki et al., "Collimated Sputtering of TiN/Ti for ULSI", Proc. 2d International Symposium on ISSP '93, Tokyo (1993)). It is also known that a low pressure Ar sputter etch, such as is frequently used to clean the bottom areas of contacts, will also facet the top corners of the contacts. The present inventors have discovered, however, that with a low pressure Ar sputter etch, it is as a practical matter impossible to create enough facetting on the top corners while still limiting the amount of material etched on the bottom of the contact. This is particularly true in production runs where high throughput is required.

SUMMARY OF THE INVENTION

The present invention enables one to efficiently facet the top corners of the contact, while not removing a significant amount of material from the bottom areas of the contact. The facetting facilitates adequate coverage of the collimated Ti/TiN PVD layers and subsequent W or Al fill.

In general, in one aspect, the invention is a method of precleaning a wafer. The method includes placing the wafer in a plasma chamber; flowing a gas into the plasma chamber; establishing a plasma in the chamber having a first pressure therein; after establishing the plasma, plasma etching the wafer at the first pressure for a first period of time; transitioning to a second pressure in the chamber, the second pressure being different from the first pressure; plasma etching the wafer at the second pressure for a second period of time; and after the second period of time has elapsed, discontinuing plasma etching at the second pressure.

Preferred embodiments include the following features. The first pressure is at least an order of magnitude different from the second pressure (e.g. an order of magnitude higher). More specifically, the first pressure is greater than 10 mTorr and the second pressure is less than 1 mTorr. The gas is a nonreactive gas, e.g. argon. The method also includes the step of maintaining a plasma in the chamber while transitioning to the second pressure and powering down the plasma chamber after discontinuing plasma etching at the second pressure. The method further includes using a vapor deposition process to deposit a metal layer on top of the top layer and in the contact holes and/or vias after completing the plasma etching step at the second pressure.

Also in preferred embodiments the plasma etching step at one of the two mentioned pressures is primarily for the purpose of facetting upper edges of the contact holes and/or vias and the plasma etching step at the other pressure is primarily for the purpose of cleaning bottoms of the contact holes and/or vias.

In general, in another aspect, the invention is an apparatus for performing a two phase plasma etching process on a wafer. The apparatus includes a chamber body; a platform within the chamber body for holding the wafer during plasma etching; a quartz bell jar mounted on the chamber body to form an enclosure surrounding the platform; a coil surrounding the quartz bell jar; a first RF supply connected to the coil for generating a plasma above the wafer; a second RF power supply supplying power to the platform to bias the wafer during plasma etching; a first mass flow controller for controlling the flow of a gas into the chamber during a low pressure phase of plasma etching; and a second mass flow controller for controlling the flow of the gas into the chamber during a high pressure phase of plasma etching, the first mass flow controller rated at a higher flow rate than the second mass flow controller.

Other advantages and features will become apparent from the following description of the preferred embodiment and from the claims.

DESCRIPTION OF THE PREFERRED EMBODIMENTS

Figure 1:
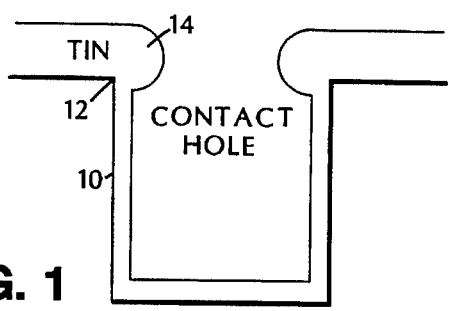
FIG. 1 illustrates the problem of "overhang" in a via or contact hole during a semiconductor device fabrication.
Figure 2:
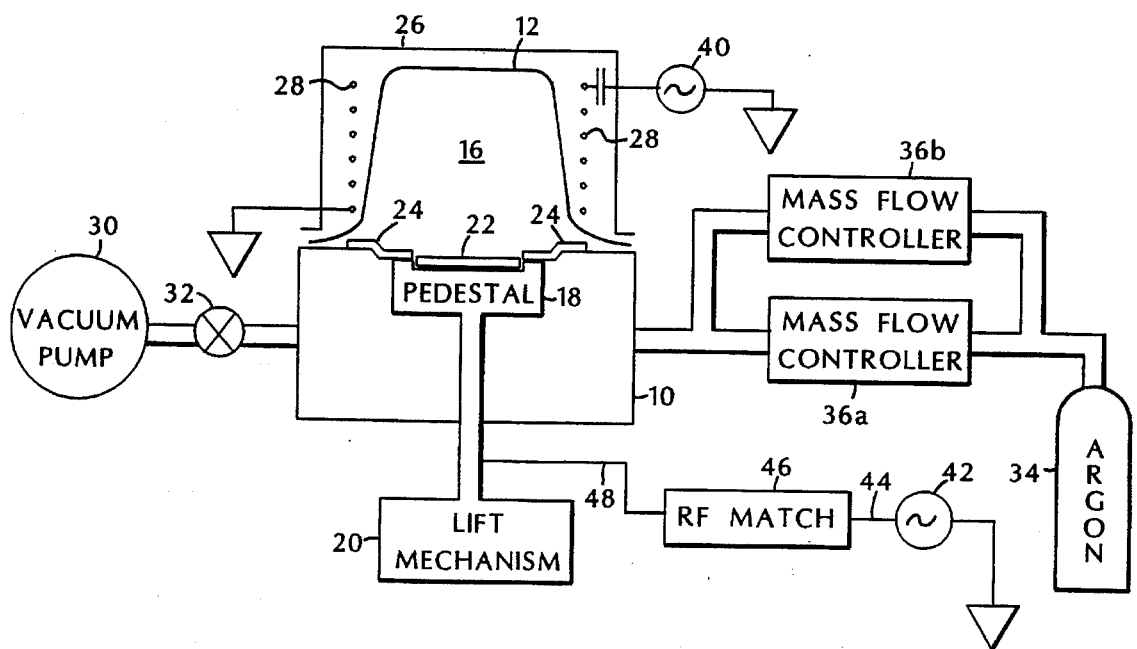
FIG. 2 is a schematic representation of a system for sputter etching a wafer.

The precleaning procedure which is the subject of this invention can be carried out in any of a variety of plasma etching systems. For the described embodiment, an Endura PVD System with a Preclean II Chamber, both of which are manufactured and sold by Applied Materials, Inc., Santa Clara, California are used. The principle components of that plasma system are shown schematically in FIG. 1.

The preclean system includes a chamber body 10 and a bell jar 12 (sometimes referred to as a dome). Bell jar 12 is mounted onto chamber body 10 to form a sealed sputtering cavity 16 for holding a vacuum and in which a plasma may be generated. Bell jar 12 is made of quartz which is a process consumable material and an internal surface is bead-blasted to promote particle adherence.

Within cavity 16, there is a pedestal 18 which can be raised and lowered by a lift mechanism 20 located beneath the chamber body. A wafer 22 which is to be etched rests on top of pedestal 18. When the wafer/pedestal is raised into position for sputtering, the outer perimeter of wafer 22 comes into contact with an annular shield 24 that is affixed to chamber body 10. Shield 22, which is made of process consumable aluminum, serves to contain the plasma above the pedestal inside the bell jar and prevent sputtering of the chamber body. It also acts as a particle catcher and traps oxide particles that are being etched from wafer 22.

Above bell jar 12 there is an RF resonator located within a grounded metal protective cover 26. The RF resonator includes a copper coil 28 wound around the outside of bell jar 12. The metal protective cover outside the resonator protects the plasma etching process from any magnetic fields that may be generated by adjacent plasma PVD chambers and it tends to improve process uniformity. RF energy from coil 28 penetrates through bell jar 12 to strike a plasma in cavity 16.

A vacuum pump 30, which is connected to chamber 10 through a line containing a throttle valve 32, evacuates the chamber in preparation for a plasma sputtering preclean. A bottle 34 of pressurized argon gas supplies argon to the chamber through a mass flow controller 36a. The desired operating pressures are obtained by appropriately setting the flow rate of argon into the chamber and the throttle valve to the vacuum pump.

Dual RF power supplies or generators 40 and 42 independently supply power to the cavity. RF generator 42 supplies capacitively coupled high frequency power (e.g. 13.56 MHz) to pedestal 18 (i.e., wafer bias power). It is a user-adjustable, all solid-state, water-cooled power source (e.g. Model CPS-1000/1356 by Comdel Inc.) that can provide 1 kW into a dummy load and is specifically tuned to prevent drifting. RF generator 42 is connected through an RF cable 44 to an RF match network 46 which in turn is connected to pedestal 18 through another cable 48. RF match network 46 adjusts the pedestal impedance to match the impedance of the RF cable (50 Ω) from RF generator 42.

RF generator 40 supplies low frequency power (e.g. 450 KHz) for the inductively coupled resonator (i.e., plasma power). RF generator 40 is an all solid-state, air-cooled plasma power source (e.g. Model LF-10 by RF Power Products Inc.) that provides 1 kW self tuned (350–450 kHz) power using an internal computer. A capacitor is added in series with the coil to match the impedance as closely as possible to 50 ohms. No matching network is needed because the lower frequency enables the generator to self-tune by slightly varying the RF frequency.

Coil 28 is powered by low-frequency power at about 450 kHz to strike a plasma in cavity 10. Increasing power to coil 20 increases the density of the plasma inside bell jar 12.

The important parameters in any preclean process are the etch rate and the uniformity of the etch. In general, these are controlled in well known ways by RF power applied, time, chamber pressure, and wafer position in the chamber. In this particular preclean system, the etch rate and the DC offset voltage are controlled independently. This is done by using RF supply 40 to produce a plasma within bell jar 12 and by using wafer bias supply 22 to generate a second plasma above the wafer acting as an independent ion source.

The invention is a two stage precleaning technique by which one can facet the entry to the contact hole without removing substantial material from the bottom of the contact holes. In general, the wafer with straight walled contact holes is first subjected to ion bombardment under high pressure in an Ar plasma. The high pressure Ar sputter etch is then followed in-situ by a low pressure sputter etch to create a clean surface in the bottom of the contact to ensure good electrical characteristics.

For a conventional low pressure (typically less than 1 milliTorr or mTorr) Ar sputter etch, ion bombardment is perpendicular to the wafer surface, and hence the amount of material removed from the bottom area's of the contact can be nearly equal (>50%) to that removed from the top corners. At significantly higher pressures (0.1 Torr–500 Torr) the amount of material removed from the bottom areas will be significantly less than that removed from the top corner of the contact holes or even the field oxide layer. Thus, a significant amount of facetting can be introduced on the top corner regions (e.g. 1000–2000 Å) while removing less than 100 Å from the bottom of the contact.

Figure 3:
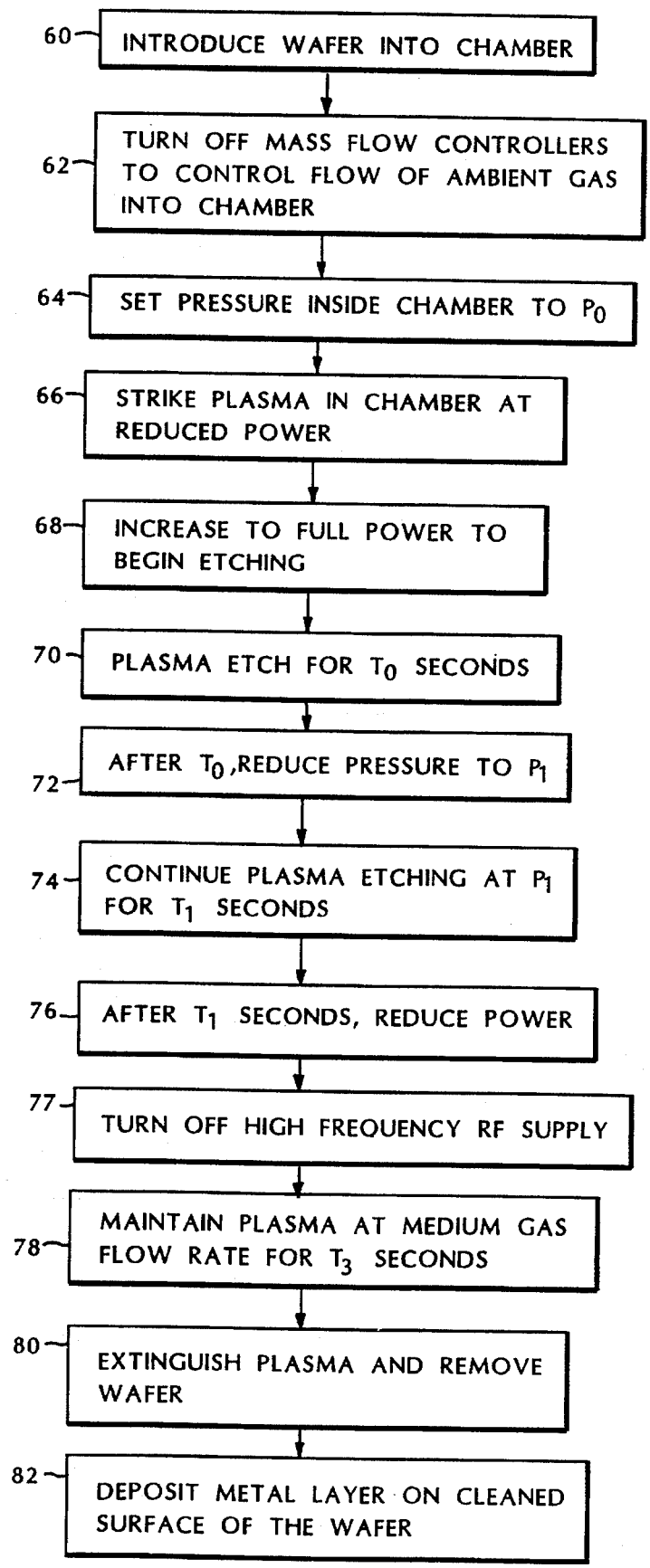
FIG. 3 is a flow chart of a two phase sputter etching process in accordance with the invention.

The steps of the two phase preclean procedure are shown in greater detail in the flow chart of FIG. 3. First the wafer is placed into the process chamber (step 60) and the mass flow controller is turned on to establish the desired flow rate of non-reactive gas (e.g. argon) through the chamber cavity (step 62). In a typical process, the flow rate is about 20 sccm (standard cubic centimeters per minute).

The subsequent preclean process involves etching steps at two different pressures $P_0$ and $P_1$. $P_1$ is set to a level first. $P_0$ is higher than $P_1$. Typically $P_0$ is set to some pressure above 10 mTorr and $P_1$ is set to a pressure significantly below $P_0$, e.g. 0.1–2.0 mTorr. The higher that $P_0$ is set, the more efficient will be the faceting that occurs.

In the described embodiment, the high pressure phase is performed first. Thus, the chamber pressure is set to $P_0$ (step 64). Once the desired operating pressure for the argon gas is achieved, the RF power to the coil is turned on to strike a plasma within the cavity (step 66). (Alternatively, the RF power to the pedestal could be used to strike the plasma.) In either case, it may also be desirable to start the plasma at a reduced power level to avoid damaging the devices on the wafer and to facilitate striking the plasma. After the plasma has been ignited, the RF power to the pedestal is turned on and both RF supplies are brought up to full process power levels to begin the first phase of the preclean etch (step 68).

The first phase of etching at the higher pressure continues until the upper corners of the contact holes have become sufficiently facetted or rounded (step 70). After the first phase of etching is complete, the pressure is lowered to $P_1$ at which the second phase of etching is performed (step 72). In the preclean system described herein, the transition to lower pressure can be performed in only a few seconds, thus there is no need to interrupt the etching process while transitioning to the new operating conditions. Once the lower pressure $P_1$ is achieved and any desired adjustments to other operating conditions are implemented, the second phase of etching begins and continues until the desired amount of material has been removed from the bottom of the contacts, i.e., until the bottom of the contacts have been cleaned in preparation for a subsequent metalization (step 74).

At the conclusion of the second phase of etching, the plasma is turned off so that the wafer can be removed for subsequent processing. In the described embodiment, rather than immediately turning off the power to the plasma, the shut down of the system is done in stages. The power to the plasma from both RF supplies is decreased significantly while still sustaining the plasma (step 76). This transition serves as a particle control measure. Afterwards, the high frequency (i.e., 13.56 MHz) RF power supply is turned off (step 77). Then, a medium flow rate (e.g. 20 sccm of argon) is established through the chamber for $T_3$ seconds (e.g. about ten seconds) while the plasma bleeds off any residual static charge from the surface of the wafer (step 78). Removing the static charge reduces the likelihood of electrostatic damage to the devices when the wafer is removed and facilitates the dechucking of the wafer from the pedestal. After ten seconds, the plasma is turned off and the wafer is removed for subsequent processing. In the described process, the subsequent step is a metalization step in which a metal layer is deposited on the wafer (step 80).

The precise details of the procedure will, of course, vary depending upon the system in which this process is performed, the type of dielectric layer that is being etched (e.g. $SiO_2$ or $Si_3N_4$), the type of ambient gas that is used during the etch process (e.g. non-reactive or reactive), and the desired process conditions. In addition, though the described embodiment placed the high pressure phase before the low pressure phase, the order may be reversed.

Presented below to illustrate the effectiveness of the high pressure etch are the results of three preclean procedures, each of which was performed on a different silicon wafer at a different argon pressure. The wafers has an $SiO_2$ field oxide layer on them with contact holes formed in the oxide. The contact holes had straight side walls and 1:1 aspect ratios. In all three preclean runs, the plasma power and DC bias power were set at about 300 watts and 125 watts, respectively. The object of the runs was to remove about the same amount of material from the field oxide layer on top of the wafer.

In the first run, the argon flow rate in the chamber was set at about 5 sccm and the pump pressure was about 0.4 mTorr. The DC bias on the wafer was about −251 volts. The plasma etch was run for about 60 seconds to remove about 395 Å (39.5 nm) of the field oxide layer. This run corresponds to standard preclean process. Examination of the contact holes using SEM (scanning electron microscope) revealed a slight rounding or facetting of the top corners of the holes and some trenching in the bottom of the contact. The facetting extended less than 20–25% of the height of the side wall. Clearly, to achieve substantial facetting under this preclean process would likely have resulted in serious damage to the devices at bottom of the contact holes.

In the second run, the argon pressure was set at about 11.7 mTorr and the DC bias voltage was about −216 volts. Since the etch rate was lower in this run due to the higher pressure, the wafer was etched for a longer period of time, i.e., about 93 seconds, in an attempt to remove the same amount as was removed in the first run. The total amount removed from the field oxide was about 456 Å (45.6 nm). The facetting extended further down the side wall of the contact (i.e., about 50%) and there was slightly less trenching than in the first run.

The third run was performed at about 63 mTorr and a DC bias of about −124 volts. Since the etch rate has decreased even further due to the increased pressure, the etch time was increased to about 189 seconds to remove an amount of oxide comparable to the other runs. Measurements indicated that about 487 Å (48.7 nm) of field oxide was removed. In this case, however, over 80% of the contact hole side wall has been facetted and there was no indication of trenching at the bottom of the contact.

The above runs confirm that at higher pressures, facetting becomes more efficient while removal of oxide from both the top of the field oxide layer and the bottom of the contact becomes less efficient. In contact holes with even more aggressive aspect ratios (i.e., deeper narrower holes) the rate of removal from the bottom of the contact will be even less efficient than in the case of the 1:1 aspect ratio contacts used in these runs. Experience also indicates that the amount of facetting that is needed to eliminate overhang is not nearly as great as 80%. Thus, the high pressure preclean need only be conducted for a short period of time.

The following mechanisms appear to explain the preferential etching of the top of contact hole relative to the bottom of the contacts. As the pressure of the Argon gas is increased, scattering of the ions in the plasma also increases. The result is to spread out the angular distribution of the ions arriving at the surface of the wafer. At low pressures, where the scattering is less, most of the ions bombarding the surface of the wafer approach along direction that is normal to the wafer. As ion scattering increases with increased pressure, the angle of incidence takes on a cosine distribution with only a small percentage of the total number of incident ions arriving along a direction that is normal to the wafer surface. Only the ions having along a trajectory that is normal to the wafer surface will make it to the bottom of the contact opening. The ions arriving at angles diverging from the normal direction, which constitutes the larger percentage of ions in the high pressure preclean process, hit the side walls of the contact before reaching the bottom of the contact. The higher the aspect ratio for the contact, the fewer the number of ions that reach the bottom.

Another mechanism which limits the erosion of the top field layer and the bottom of the contact during high pressure preclean is redeposition. The material that is sputtered off of the top surface of the field layer or off of the bottom of the contact is back scattered and redeposits onto the surface from which it came. This redeposition of some of the sputtered material reduces the effective etch rate. Along the side wall at the top of the contact hole, less of the sputtered material returns to the area of the contact hole side wall from which it came.

Other embodiments are within the following claims. For example, the system of FIG. 1 could be modified to include a second mass flow controller 36b. As the above results seem to suggest, the larger the difference in pressure during the two etch phases, the more pronounced is the effect. Thus, the high pressure etch could be performed at 100 mTorr and the low pressure etch at 1 mTorr. A single mass flow controller is not well suited to operate the wide range of flow rates implied by those two pressures. Moreover, the use of a throttle valve on the vacuum pump line to compensate for the limited operating range of a single mass flow controller is not an optimum solution for production purposes. Thus, in the alternative embodiment, the first mass flow controller 36a (e.g. rated at about 20 sccm) is used to establish a low pressure in the chamber (e.g. below 1 mTorr) and the second mass flow controller 36b (e.g. rate at above 300 sccm) is used to establish a high pressure in the chamber.

What is claimed is:

1. A method of pretreating a wafer comprising:

placing the wafer in a plasma chamber;

flowing a gas into the plasma chamber;

establishing a plasma in said chamber having a first pressure therein;

after establishing the plasma, plasma etching said wafer at the first pressure for a first period of time;

transitioning to a second pressure in said chamber, said second pressure being different from said first pressure;

plasma etching said wafer at the second pressure for a second period of time; and after the second period of time has elapsed, discontinuing plasma etching at said second pressure.

2. The method of claim 1 wherein said first pressure is at least an order of magnitude different from said second pressure.

3. The method of claim 2 wherein said first pressure is higher than said second pressure.

4. The method of claim 3 wherein said first pressure is above 10 mTorr.

5. The method of claim 4 wherein said first pressure is greater than about 50 mTorr.

6. The method of claim 5 wherein said first pressure is greater than 100 mTorr.

7. The method of claim 3 wherein said second pressure is below 10 mTorr.

8. The method of claim 7 wherein said second pressure is below 1 mTorr.

9. The method of claim 2 wherein said first pressure is above 10 mTorr and said second pressure is below 1 mTorr.

10. The method of claim 3 wherein said gas is a nonreactive gas.

11. The method of claim 10 wherein said gas is argon.

12. The method of claim 3 further comprising maintaining a plasma in said chamber while transitioning to said second pressure.

13. The method of claim 3 further comprising powering down the plasma chamber after discontinuing plasma etching at said second pressure.

14. The method of claim 1 wherein said wafer has a top layer with contact holes formed therein and further comprising using a vapor deposition process to deposit a metal layer on top of the top layer and in said contact holes after completing the plasma etching step at said second pressure.

15. The method of claim 1 wherein said wafer has a top layer with contact holes formed therein, and wherein the plasma etching step at one of the two mentioned pressures is primarily for the purpose of facetting upper edges of said contact holes and the plasma etching step at the other pressure is primarily for the purpose of cleaning bottoms of said contact holes.

16. A method of pretreating a wafer having a top layer with contact holes formed therein, said method comprising:

placing the wafer in a plasma chamber;

flowing a gas through the plasma chamber;

establishing a first pressure in said chamber with the gas flowing through the chamber, said first pressure selected such that plasma etching at said first pressure is primarily for the purpose of facetting upper corners of the contact holes;

striking a plasma in said chamber;

after striking the plasma, plasma etching said wafer at the first pressure for a first period of time;

establishing a second pressure in said chamber, said second pressure being lower than said first pressure, said second pressure selected such that plasma etching at said second pressure is primarily for the purpose of cleaning bottoms of said contact holes;

plasma etching said wafer at the second pressure for a second period of time; and after the second period of time has elapsed, discontinuing plasma etching at said second pressure.

17. An apparatus for performing a two phase plasma etching process on a wafer, said apparatus comprising:

a chamber body;

a platform within said chamber body for holding the wafer during plasma etching;

a quartz bell jar mounted on the chamber body to form an enclosure surrounding the platform;

a coil surrounding the quartz bell jar;

a first RF supply connected to the coil for generating a plasma above the wafer;

a second RF power supply supplying power to the platform to bias the wafer during plasma etching;

a first mass flow controller for controlling the flow of a gas into the chamber during a low pressure phase of plasma etching; and a second mass flow controller for controlling the flow of the gas into the chamber during a high pressure phase of plasma etching, said first mass flow controller rated at a higher flow rate than said second mass flow controller.

18. The method of claim 1 wherein said wafer has a top layer with vias formed therein and further comprising using a vapor deposition process to deposit a metal layer on top of the top layer and in said vias after completing the plasma etching step at said second pressure.

19. The method of claim 1 wherein said wafer has a top layer with vias formed therein, and wherein the plasma etching step at one of the two mentioned pressures is primarily for the purpose of facetting upper edges of said vias and the plasma etching step at the other pressure is primarily for the purpose of cleaning inside of said vias.

* * * * *

UNITED STATES PATENT AND TRADEMARK OFFICE
CERTIFICATE OF CORRECTION

PATENT NO. : 5,460,689
DATED : October 24, 1995
INVENTOR(S) : Ivo J. Raaijmakers and Jaim Nulman It is certified that error appears in the above-indentified patent and that said Letters Patent is hereby corrected as shown below:

On the title page, the illustrative Figure and in the drawings Figure 3, Box 62, line 1, replace "OFF" with --ON--.

Signed and Sealed this

Second Day of July, 1996

Attest:

BRUCE LEHMAN

*Attesting Officer*           *Commissioner of Patents and Trademarks*